(12) United States Patent
Yoo et al.

(10) Patent No.: US 10,726,775 B2
(45) Date of Patent: Jul. 28, 2020

(54) TWO-PANEL DISPLAY DEVICE

(71) Applicant: LG Display Co., Ltd., Seoul (KR)

(72) Inventors: Seungjin Yoo, Paju-si (KR); JangHwan Kim, Paju-si (KR); Dongwon Park, Paju-si (KR); JoonHee Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/233,799

(22) Filed: Dec. 27, 2018

(65) Prior Publication Data

US 2019/0206308 A1    Jul. 4, 2019

(30) Foreign Application Priority Data

Dec. 29, 2017  (KR) .................. 10-2017-0184190

(51) Int. Cl.
*G09G 3/32*      (2016.01)
*H05K 1/18*      (2006.01)
*H05K 1/14*      (2006.01)
*G06F 3/14*      (2006.01)
*G09G 3/20*      (2006.01)

(52) U.S. Cl.
CPC .............. *G09G 3/32* (2013.01); *G06F 3/1423* (2013.01); *G09G 3/20* (2013.01); *H05K 1/147* (2013.01); *H05K 1/189* (2013.01); *G09G 2300/0408* (2013.01); *G09G 2310/08* (2013.01); *G09G 2320/043* (2013.01); *H05K 2201/10128* (2013.01)

(58) Field of Classification Search
CPC ........ H05K 1/147; H05K 1/148; H05K 1/189; H05K 2201/10128; G09G 3/32; G09G 3/20; G09G 3/3275; G09G 3/3225; G09G 3/3233; G09G 3/3266; G09G 3/3258; G09G 3/3291; G09G 2310/08; G09G 2320/043; G09G 2320/045; G06F 3/1423
See application file for complete search history.

(56) References Cited

U.S. PATENT DOCUMENTS

| | | | | |
|---|---|---|---|---|
| 10,341,637 | B1 * | 7/2019 | Richards | H04N 13/133 |
| 10,482,825 | B2 * | 11/2019 | Kim | G09G 3/3266 |
| 10,497,332 | B2 * | 12/2019 | Yamagishi | G09G 3/3696 |
| 2005/0052439 | A1 * | 3/2005 | Liou | G09G 3/20 |
| | | | | 345/204 |
| 2010/0265224 | A1 * | 10/2010 | Cok | G09G 3/3266 |
| | | | | 345/206 |
| 2012/0140160 | A1 * | 6/2012 | Han | G02F 1/13336 |
| | | | | 349/144 |

(Continued)

*Primary Examiner* — Sardis F Azongha
(74) *Attorney, Agent, or Firm* — Polsinelli PC

(57) ABSTRACT

A two-panel display device includes first source driver ICs arranged at one side of a first display area, supplying a first data voltage, second source driver ICs arranged at one side of a second display area arranged to adjoin the first display area, supplying a second data voltage, and at least one or more read out ICs arranged between the first display area and the second display area, being supplied with sensing voltages sensed in the first and second display areas, wherein the first source driver ICs are arranged in a direction opposite to the read out ICs with the first display area interposed therebetween, and the second source driver ICs are arranged in a direction opposite to the read out ICs with the second display area interposed therebetween.

20 Claims, 8 Drawing Sheets

(56) References Cited

U.S. PATENT DOCUMENTS

| | | | | |
|---|---|---|---|---|
| 2012/0194773 A1* | 8/2012 | Kim | .................... | G02F 1/13336 |
| | | | | 349/139 |
| 2014/0204065 A1* | 7/2014 | Park | ...................... | G09G 5/006 |
| | | | | 345/204 |
| 2015/0130777 A1* | 5/2015 | Park | .................... | G09G 3/2085 |
| | | | | 345/206 |
| 2015/0348492 A1* | 12/2015 | Park | .................... | G09G 3/3666 |
| | | | | 345/205 |
| 2016/0133189 A1* | 5/2016 | Kang | ................... | G09G 3/3258 |
| | | | | 345/211 |
| 2017/0186370 A1* | 6/2017 | Lee | ...................... | G09G 3/3233 |
| 2017/0365217 A1* | 12/2017 | An | ...................... | G09G 3/3233 |
| 2018/0018917 A1* | 1/2018 | Yoo | .................... | G09G 3/3266 |

\* cited by examiner

TWO-PANEL DISPLAY DEVICE

CROSS-REFERENCE TO RELATED APPLICATION

This application claims the benefit of the Korean Patent Application No. 10-2017-0184190 filed on Dec. 29, 2017, which is hereby incorporated by reference in its entirety as if fully set forth herein.

BACKGROUND

Field of the Disclosure

The present disclosure relates to a two-panel display device.

Description of the Background

Many technologies in the field of a display device for displaying visual information as image or picture in an information age have been developed. An example of the display device includes a display device of a two-panel structure having two display areas. The two-panel display device includes a left panel for displaying an image visible to a left eye of a user and a right panel for displaying an image visible to a right eye of the user. The two-panel display device may be applied to a virtual reality (VR) or augmented reality (AR) display device.

If resolution of a panel is increased to improve picture quality in the two-panel display device, even though a source pad connected to a data line to output a data voltage is arranged in a source driver IC to have a minimum pitch and a minimum space, a physical space is not sufficient. The source pad is currently arranged on four rows within the source driver IC, and source pads alternately arranged on different rows are connected with data lines in a 4-staggered structure. Therefore, it is not physically easy to add a pad for connection with a sensing line to which a sensed voltage is supplied or a reference line for supplying a reference voltage, to the panel.

Since the two-panel display device has a narrow pixel space provided on a display area within the panel, it is not easy to apply a pixel structure for internal compensation to the two-panel display device. In this case, internal compensation for compensating for a threshold voltage of a driving transistor and a degradation level of a light emitting diode cannot be performed by a circuit constituting pixels.

Also, since the two-panel display device also has a narrow space of a pad and link portion, which should additionally be arranged in the source driver IC to perform external compensation, it is not easy to arrange the sensing line and the reference line in the two-panel display device. In this case, external compensation for performing compensation by generating sensing data including information on a degradation level of a light emitting diode and a threshold voltage of a driving transistor in real time through an analog-digital converter arranged outside a display area cannot be performed.

Compensation prior to launching, which is performed after a threshold voltage of a driving transistor and a degradation level of a light emitting diode are measured externally through a camera, has been only applicable to the two-panel display device of the related art. The two-panel display device has been launched after compensation through a visual test, and the two-panel display device which has been launched has no means for performing compensation. Therefore, compensation cannot be performed for the two-panel display device of the related art after launching of the two-panel display device. For this reason, since the threshold voltage of the driving transistor and degradation of the light emitting diode cannot be compensated, reliability cannot be obtained.

SUMMARY

The present disclosure has been made in view of the above problems, and it is an object of the present disclosure to provide a two-panel display device that can compensate for a threshold voltage of a driving transistor and degradation of a light emitting diode even after launching by realizing a structure for performing external compensation even in case of high resolution.

In accordance with an aspect of the present disclosure, the above and other objects can be accomplished by the provision of a two-panel display device comprising first source driver ICs arranged at one side of a first display area, supplying a first data voltage, second source driver ICs arranged at one side of a second display area arranged to adjoin the first display area, supplying a second data voltage, and at least one or more read out ICs arranged between the first display area and the second display area, being supplied with sensing voltages sensed in the first and second display areas, wherein the first source driver ICs are arranged in a direction opposite to the read out ICs with the first display area interposed therebetween, and the second source driver ICs are arranged in a direction opposite to the read out ICs with the second display area interposed therebetween.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION DISCLOSURE

Figure 1:
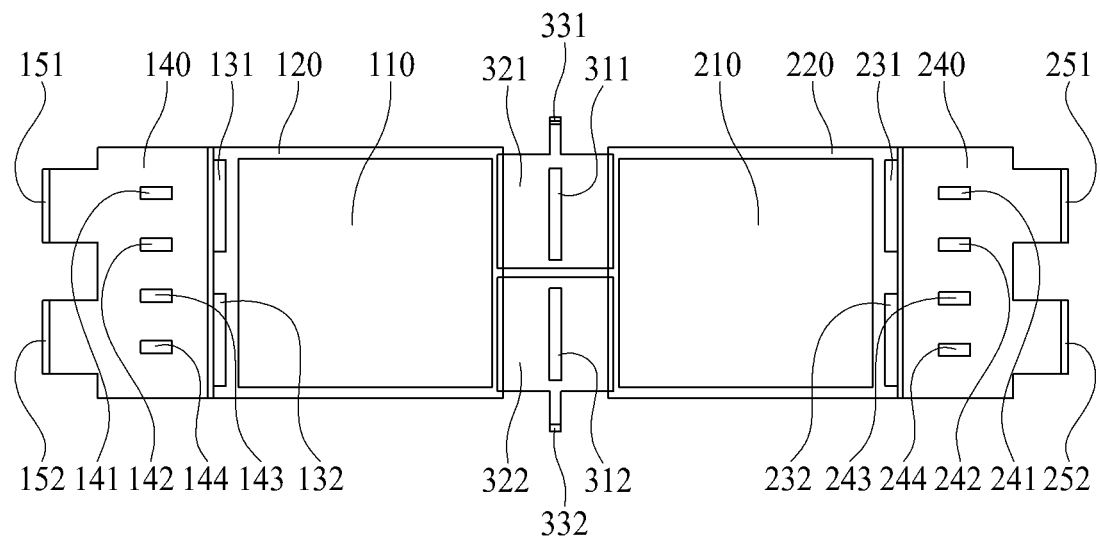
FIG. 1 is a plane view illustrating a two-panel display device according to one aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "X-axis direction," "Y-axis direction," and "Z-axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, the aspects of the present disclosure will be described in detail with reference to the accompanying drawings.

FIG. 1 is a plane view illustrating a two-panel display device according to one aspect of the present disclosure. The two-panel display device according to one aspect of the present disclosure includes a first display area 110, a first non-display area 120, first source driver ICs 131 and 132, a first flexible printed circuit board 140, first driver ICs 141 to 144, first data input terminals 151 and 152, a second display area 210, a second non-display area 220, second source driver ICs 231 and 232, a second flexible printed circuit board 240, second driver ICs 241 to 244, second data input terminals 251 and 252, a first read-out IC 311, a second read-out IC 312, a first flexible film 321, a second flexible film 322, a first sensing output terminal 331, and a second sensing output terminal 332.

The first display area 110 is provided on an entire surface of the two-panel display device. The first display area 110 is an area for displaying an image visible to a left eye of a user. Pixels may be provided in the first display area 110 to display images. A light emitting diode of the pixels provided in the first display area 110 according to the present disclosure may be realized as an organic light emitting diode. However, without limitation to this example, the light emitting diode of the first display area 110 may be realized as a quantum dot light emitting diode or a micro-light emitting diode (μ-LED).

The first non-display area 120 is provided to surround the first display area 110. The first non-display area 120 may be arranged outside corners of the first display area 110, and may include a plurality of sides having a predetermined width. The first non-display area 120 protects the first display area 110 from external impact. The first source driver ICs 131 and 132 may be packaged on one of the plurality of sides constituting the first non-display area 120 according to one aspect. FIG. 1 illustrates that two first source driver ICs 131 and 132 are arranged. However, without limitation to this case, at least one or more first source driver ICs 131 and 132 may be arranged on the first non-display area 120.

The first source driver ICs 131 and 132 are arranged at one side of the first display area 110. The first source driver ICs 131 and 132 supply a first data voltage set to allow pixels provided in the first display area 110 to emit light at luminance which is set. The first source driver ICs 131 and 132 are connected with the pixels provided in the first display area 110 through a plurality of data lines. For example, if two first source driver ICs 131 and 132 are provided, the first source driver IC 131 arranged at an upper portion is connected with the data line arranged at a half of the upper portion of the first display area 110. Also, the first source driver IC 132 arranged at a lower portion is connected with the data line arranged at a half of the lower portion of the first display area 110.

The first flexible printed circuit board 140 is attached to one side of the first non-display area 120. The first flexible printed circuit board 140 is attached to one side of the first non-display area 120 to partially overlap the first non-display area 120 arranged to adjoin the first source driver ICs 131 and 132 of the first non-display area 120. Since the first flexible printed circuit board 140 is a flexible printed circuit board (FBCB), its shape may be deformed in accordance with a structure of the two-panel display device.

The first driver ICs 141 to 144 may be packaged on the first flexible printed circuit board 140. The first driver ICs 141 to 144 generate driving signals and driving voltages such that the first source driver ICs 131 and 132 may supply a data voltage and normally display an image on the first display area 110. Alternatively, the first driver ICs 141 to 144 are supplied with the driving signals and the driving voltages from the outside of the first flexible printed circuit board 140 and then supply the driving signals and the driving voltages to the first source driver ICs 131 and 132 and the first display area 110.

The first data input terminals 151 and 152 are provided at one side of the first flexible printed circuit board 140. The first data input terminals 151 and 152 are supplied with first digital video data supplied to the first source driver ICs 131 and 132. The first flexible printed circuit board 140 supplies the first digital video data supplied to the first data input terminals 151 and 152 to the first source driver ICs 131 and 132. The first data input terminals 151 and 152 may be realized as signal input and output pins made of metal.

The second display area 210 is provided on the entire surface of the two-panel display device. The second display area 210 is an area for displaying an image visible to a right eye of a user. Pixels may be provided in the second display area 210 to display images. The second display area 210 is arranged to be spaced apart from the first display area 110. The second display area 210 may be spaced apart from the first display area 110 and thus supplied with a second data voltage to display an image independently from the first display area 110. A viewing angle of the second display area 210 may be set to be different from that of the first display area 110. Therefore, since the user may feel a stereoscopic effect due to a difference between the image visible to the left eye and the image visible to the right eye, virtual reality or augmented reality may visually be realized.

The second non-display area 220 is provided to surround the second display area 210. The second non-display area 220 may be arranged outside corners of the second display area 210, and may include a plurality of sides having a predetermined width. The second non-display area 220 protects the second display area 210 from external impact. The second source driver ICs 231 and 232 may be packaged on one of the plurality of sides constituting the second non-display area 220 according to one aspect. FIG. 1 illustrates that two second source driver ICs 231 and 232 are arranged. However, without limitation to this case, at least one or more second source driver ICs 231 and 232 may be arranged on the second non-display area 220.

The second source driver ICs 231 and 232 are arranged at one side of the second display area 210. The second source driver ICs 231 and 232 supply a second data voltage set to allow pixels provided in the second display area 210 to emit light at luminance which is set. The second source driver ICs 231 and 232 are connected with the pixels provided in the second display area 210 through a plurality of data lines. For example, if two second source driver ICs 231 and 232 are provided, the second source driver IC 231 arranged at an upper portion is connected with the data line arranged at a half of the upper portion of the second display area 210. Also, the second source driver IC 232 arranged at a lower portion is connected with the data line arranged at a half of the lower portion of the second display area 210.

The second flexible printed circuit board 240 is attached to one side of the second non-display area 220. The second flexible printed circuit board 240 is attached to one side of the second non-display area 220 to partially overlap the second non-display area 220 arranged to adjoin the second source driver ICs 231 and 232 of the second non-display area 220. Since the second flexible printed circuit board 240 is a flexible printed circuit board (FBCB), its shape may be deformed in accordance with a structure of the two-panel display device.

The second driver ICs 241 to 244 may be packaged on the second flexible printed circuit board 240. The second driver ICs 241 to 244 generate driving signals and driving voltages such that the second source driver ICs 231 and 232 may supply a data voltage and normally display an image on the second display area 210. Alternatively, the second driver ICs 241 to 244 are supplied with the driving signals and the driving voltages from the outside of the second flexible printed circuit board 240 and then supply the driving signals and the driving voltages to the second source driver ICs 231 and 232 and the second display area 210.

The second data input terminals 251 and 252 are provided at one side of the second flexible printed circuit board 240. The second data input terminals 251 and 252 are supplied with second digital video data supplied to the second source driver ICs 231 and 232. The second flexible printed circuit board 240 supplies the second digital video data supplied to the second data input terminals 251 and 252 to the second source driver ICs 231 and 232. The second data input terminals 251 and 252 may be realized as signal input and output pins made of metal.

The first and second read out integrated circuits (ICs) 311 and 312 are arranged between the first display area 110 and the second display area 210. The first read out IC 311 is arranged between the upper portion of the first display area 110 and the upper portion of the second display area 210. The second read out IC 312 is arranged between the lower portion of the first display area 110 and the lower portion of the second display area 210. FIG. 1 illustrates that two read out ICs 311 and 312 are arranged. However, without limitation to this case, at least one or more read out ICs 311 and 312 may be arranged between the first display area 110 and the second display area 210.

The first and second read out ICs 311 and 312 are realized as ROICs. The read out IC is one of sensing circuits. The read out IC is used to sense a mechanical or electric interface generated from a sensing target such as a flat panel thin film transistor circuit. The read out IC may apply a reference voltage to each sensing circuit or supply an input signal to each sensing circuit. The read out IC is supplied with a voltage, current or electromagnetic signal sensed from the sensing target. The read out IC stores the sensed voltage, current or electromagnetic signal in a memory or supplies the sensed voltage, current or electromagnetic signal to an external control circuit.

The first and second read out ICs 311 and 312 are supplied with sensing voltages sensed from the first and second display areas 110 and 210. The first and second read out ICs 311 and 312 may store information on the sensing voltages sensed from the first and second display areas 110 and 210 or supply the information to the outside.

The first flexible film 321 is arranged between the first and second display areas 110 and 210. The first flexible film 321 is arranged between the upper portion of the first display area 110 and the upper portion of the second display area 210. The first flexible film 321 may be arranged to partially overlap the other side of the first non-display area 120 and the other side of the second non-display area 220. The first flexible film 321 may be attached onto the first and second non-display areas 110 and 220. The first read out IC 311 may be packaged on the first flexible film 321.

The second flexible film 322 is arranged between the first and second display areas 110 and 210. The second flexible film 322 is arranged between the lower portion of the first display area 110 and the lower portion of the second display area 210. The second flexible film 322 may be arranged to partially overlap the other side of the first non-display area 120 and the other side of the second non-display area 220. The second flexible film 322 may be attached onto the first and second non-display areas 110 and 220. The second read out IC 312 may be packaged on the second flexible film 322.

The first sensing output terminal 331 is arranged at one side of the first flexible film 321. The first sensing output terminal 331 is arranged in the first flexible film 321 to be protruded in a direction different from a direction where the first and second display areas 110 and 2210 are arranged. The first sensing output terminal 331 outputs the sensing data generated using the sensing voltage by the first read out IC 311 to the outside of the first flexible film 321. The first sensing output terminal 331 may be realized as signal input and output pins made of metal.

The second sensing output terminal 332 is arranged at one side of the second flexible film 322. The second sensing output terminal 332 is arranged in the second flexible film 322 to be protruded in a direction different from the direction where the first and second display areas 110 and 2210 are arranged. The second sensing output terminal 332 outputs the sensing data generated using the sensing voltage by the second read out IC 312 to the outside of the second flexible film 322. The second sensing output terminal 332 may be realized as signal input and output pins made of metal.

The first source driver ICs 131 and 132 according to one aspect are arranged in a direction opposite to the first and second read out ICs 311 and 312 with the first display area 110 interposed therebetween. For example, if the first and second read out ICs 311 and 312 are arranged at a right side of the first display area 110, the first source driver IC 131 and 132 are arranged at a left side of the first display area 110.

Also, the second source driver ICs 231 and 232 according to one aspect are arranged in a direction opposite to the first and second read out ICs 311 and 312 with the second display area interposed therebetween. For example, if the first and second read out ICs 311 and 312 are arranged at a left side of the second display area 210, the second source driver ICs 231 and 232 are arranged at a right side of the second display area 210.

Since the first and second read out ICs 311 and 312 are arranged between the first and second display areas 110 and 210, in order that the first source driver ICs 131 and 132 are arranged in a direction opposite to the first and second read out ICs 311 and 312 with the first display area 110 interposed therebetween, the first source driver ICs 131 and 132 are arranged in an opposite direction of the second display area 210 based on the first display area 110. Also, in order that the second source driver ICs 231 and 232 are arranged in a direction opposite to the first and second read out ICs 311 and 312 with the second display area 210 interposed therebetween, the second source driver ICs 231 and 232 are arranged in an opposite direction of the first display area 110 based on the second display area 210.

For example, the first and second source driver ICs 131, 132, 231 and 232 may be arranged at both sides of the two-panel display device, and the first and second read out ICs 311 and 312 may be arranged at a center portion of the two-panel display device. The first and second read out ICs 311 and 312 may sense the threshold voltage of the driving transistor of the pixel provided in the first and second display areas 110 and 210 and a degradation level of the light emitting diode, and may be supplied with the sensing voltage. Therefore, since the first and second source driver ICs 131, 132, 231 and 232 are not required to be supplied with the sensing voltage, a separate pad for connection with the sensing lines is not required in the first and second source driver ICs 131, 132, 231 and 232. In this case, the sensing voltage for external compensation may be sensed using the first and second read out ICs 311 and 312 even without additional elements in the first and second source driver ICs 131, 132, 231 and 232.

Figure 2:
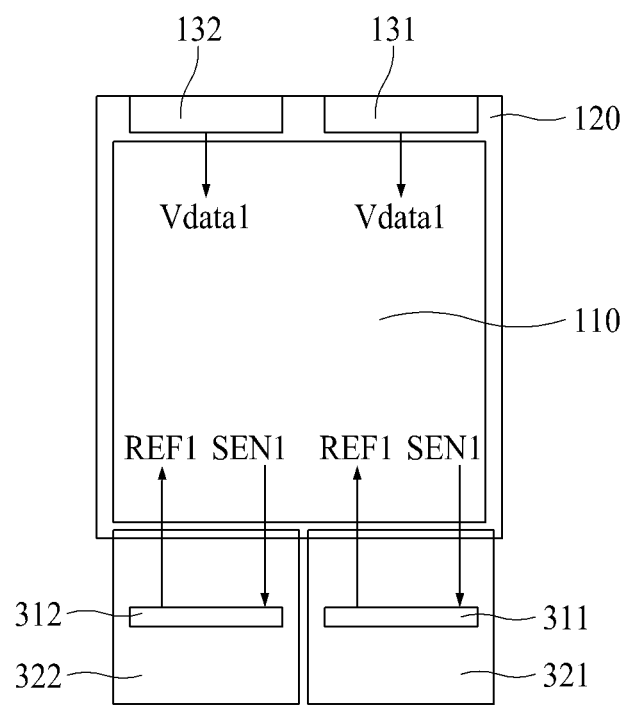
FIG. 2 is a plane view illustrating a voltage input and output relation of a two-panel display device according to one aspect of the present disclosure.

FIG. 2 is a plane view illustrating a voltage input and output relation of a two-panel display device according to one aspect of the present disclosure.

The first source driver ICs 131 and 132 supply a first data voltage Vdata1 to the first display area 110. The first display area 110 may display an image of set luminance through the first data voltage Vdata1 supplied from the first source driver ICs 131 and 132. Although omitted in FIG. 2, the second source driver ICs 231 and 232 supply a second data voltage Vdata2 to the second display area 210 in the same manner. The second display area 210 may display an image of set luminance through the second data voltage Vdata2 supplied from the second source driver ICs 231 and 232.

The first and second read out ICs 311 and 312 are supplied with a first sensing voltage SEN1 from the first display area 110. The first and second read out ICs 311 and 312 sense the threshold voltage of the driving transistor of the pixel and a degradation level of the light emitting diode within the set range of the first display area 110. Although omitted in FIG. 2, the first and second read out ICs 311 and 312 are supplied with a second sensing voltage SEN2 from the second display area 210 in the same manner. The first and second read out ICs 311 and 312 sense the threshold voltage of the driving transistor of the pixel and the degradation level of the light emitting diode within the set range of the second display area 210.

Also, the first and second read out ICs 311 and 312 supply a first reference voltage REF1 to the first display area 110. The first reference voltage REF1 is commonly supplied to the driving transistor and the light emitting diode of the pixels provided in the first display area 110 to set a reference of driving. Although omitted in FIG. 2, the first and second read out ICs 311 and 312 supply a second reference voltage REF2 to the second display area 210 in the same manner. The second reference voltage REF2 is commonly supplied to the driving transistor and the light emitting diode of the pixels provided in the second display area 210 to set a reference of driving.

If the first and second read out ICs 311 and 312 supply a reference voltage, a separate line for supplying the reference voltage is not arranged in the first and second display areas 110 and 210, and the reference voltage may be supplied through the sensing line connected with the first and second read out ICs 311 and 312. Since the reference voltage may be supplied using the sensing line for performing external compensation, line design of the two-panel display device may be performed more easily in accordance with decrease of the number of additional lines.

Figure 3:
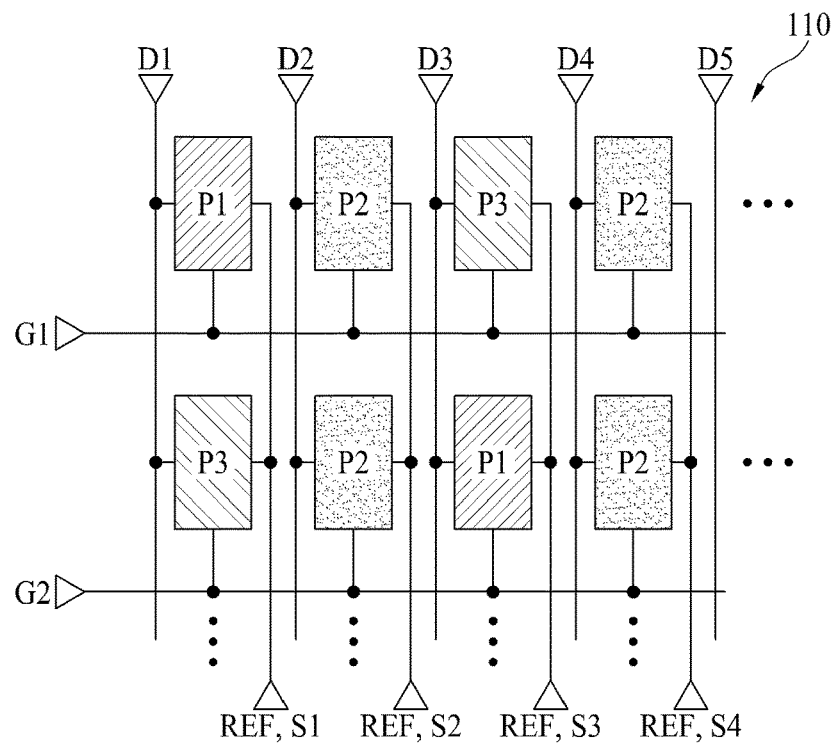
FIG. 3 is a detailed plane view illustrating a first display area according to one aspect of the present disclosure.

FIG. 3 is a detailed plane view illustrating a first display area 110 according to one aspect of the present disclosure. First to third pixels P1 to P3, a plurality of data lines D1 to D5, a plurality of gate lines G1 and G2 and a plurality of sensing lines S1 to S4 are provided in the first display area 110 according to one aspect of the present disclosure. Although not shown in FIG. 3, the second display are 210 may have the same structure as that of the first display area 110.

The plurality of data lines D1 to D5 are connected with the first to third pixels P1 to P3. The plurality of data lines D1 to D5 supply a data voltage to the first to third pixels P1 to P3.

The plurality of gate lines G1 and G2 are connected with the first to third pixels P1 to P3. The plurality of gate lines G1 and G2 supply a gate signal to the first to third pixels P1 to P3. If a gate driver is realized as a gate in panel (GIP) circuit, the gate signal may be a plurality of gate clocks having their respective phases different from each other.

The plurality of sensing lines S1 to S4 are connected with the first to third pixels P1 to P3. The plurality of sensing lines S1 to S4 sense a threshold voltage of the first to third pixels P1 to P3. The plurality of sensing lines S1 to D4 may sense a degradation level of the first to third pixels P1 to P3.

The first and second read out ICs 311 and 312 which should supply a sensing voltage through the sensing lines S1 to S4 are arranged in an opposite direction of the first source driver ICs 131 and 132. For example, in FIG. 3, the first and second read out ICs 311 and 312 are arranged at the lower portion, and the first source driver ICs 131 and 132 are arranged at the upper portion. Since the data voltage is supplied from the first source driver ICs 131 and 132, a supply direction of the data voltage is directed from the upper portion to the lower portion. Also, since the threshold voltage is sensed and then supplied to the first and second read out ICs 311 and 312, a sensing direction of the threshold voltage is also directed from the upper portion to the lower portion. Therefore, the supply direction of the data voltage is the same as the sensing direction of the threshold voltage.

Also, the plurality of sensing lines S1 to S4 supply the reference voltage REF to the plurality of pixels P1 to P3. At this time, the supply direction of the data voltage is opposite to the supply direction of the reference voltage REF. For example, in FIG>3, the supply direction of the data voltage is directed from the upper portion to the lower portion. Also, since the reference voltage REF is supplied from the first and second read out ICs 311 and 312 arranged at the lower portion, the supply direction of the reference voltage REF is directed from the lower portion to the upper portion. Therefore, the supply direction of the data voltage is opposite to the supply direction of the reference voltage REF.

Figure 4:
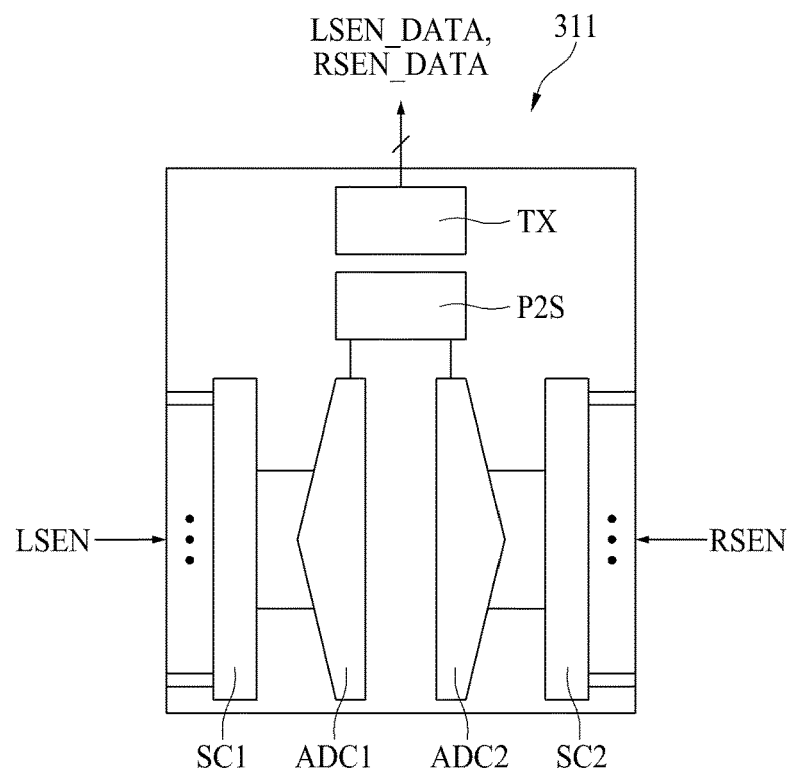
FIG. 4 is a detailed plane view illustrating a first read-out IC according to one aspect of the present disclosure.

FIG. 4 is a detailed plane view illustrating a first read-out IC 311 according to one aspect of the present disclosure. The first read out IC 311 according to one aspect of the present disclosure includes first and second sampling circuits SC1 and SC2, first and second analog-digital converters ADC1 and ADC2, and an integrated portion (P2S), and an output portion TX. Although not shown in FIG. 4, the second read out IC 312 may have the same structure as that of the first read out IC 311.

The first sampling circuit SC1 is supplied with a left sensing voltage LSEN from the first display area 110. The first sampling circuit SC1 reads out and samples a value of the left sensing voltage LSEN supplied in an analog type every set period. For example, if the sampling period is 10 μm, the first sampling circuit SC1 reads out the value of the supplied left sensing voltage LSEN every 10 μm and stores a voltage value of the corresponding timing.

The second sampling circuit SC2 is supplied with a right sensing voltage RSEN from the second display area 210. The second sampling circuit SC2 reads out and samples a value of the right sensing voltage RSEN supplied in an analog type every set period. For example, if the sampling period is 10 μm, the second sampling circuit SC2 reads out the value of the supplied right sensing voltage RSEN every 10 μm and stores a voltage value of the corresponding timing.

The first analog-digital converter ADC1 is supplied with the left sensing voltage LSEN sampled by the first sampling circuit SC1. The first analog-digital converter ADC1 converts the left sensing voltage LSEN to left sensing data LSEN_DATA. The left sensing data LSEN_DATA is digital data including information on the left sensing voltage LSEN.

The second analog-digital converter ADC2 is supplied with the right sensing voltage RSEN sampled by the second sampling circuit SC2. The second analog-digital converter ADC2 converts the right sensing voltage RSEN to right sensing data RSEN_DATA. The right sensing data RSEN_DATA is digital data including information on the right sensing voltage RSEN.

The integrated portion P2S is supplied with the left sensing data LSEN_DATA converted by the first analog-digital converter ADC1. The integrated portion P2S is supplied with the right sensing data RSEN_DATA converted by the second analog-digital converter ADC2. The integrated portion P2S aligns the left sensing data LSEN_DATA and the right sensing data RSEN_DATA. As the integrated portion P2S aligns the left sensing data LSEN_DATA and the right sensing data RSEN_DATA, the first read out IC 311 may simultaneously perform compensation for the first and second display areas 110 and 210. The output portion TX outputs the left sensing data LSEN_DATA and the right sensing data RSEN_DATA aligned by the integrated portion P2S.

Figure 5:
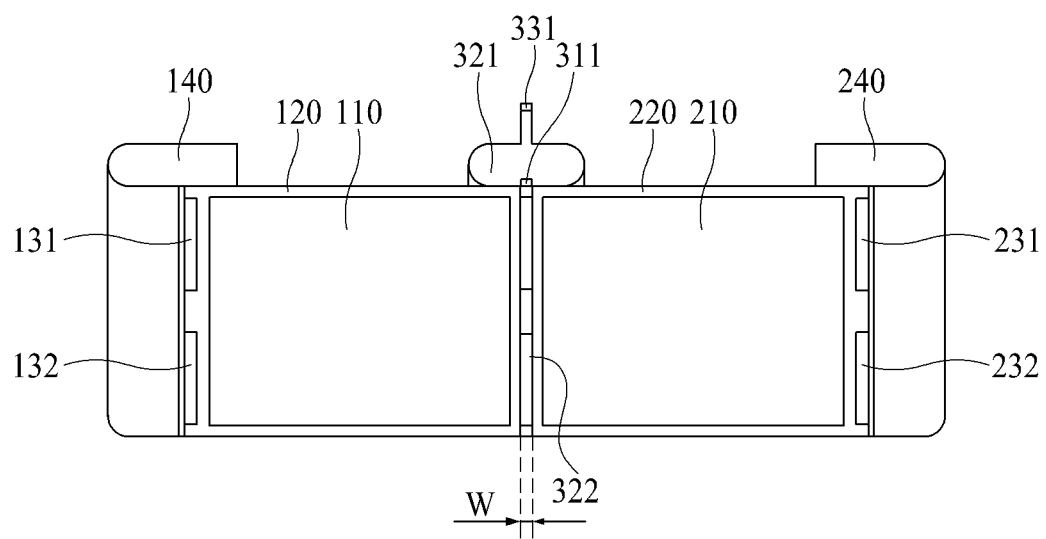
FIG. 5 is a front view illustrating an assembly state of a two-panel display device according to one aspect of the present disclosure.

FIG. 5 is a front view illustrating an assembly state of a two-panel display device according to one aspect of the present disclosure.

The first and second flexible printed circuit boards 140 and 240 are arranged to be rolled toward rear surfaces of the first and second non-display areas 120 and 220. The first and second flexible printed circuit boards 140 and 240 are extended from one sides of the first and second non-display areas 120 and 220 and bent toward rear directions of the first and second display areas 110 and 210. The rear surfaces of the first and second flexible printed circuit boards 140 and 240 are arranged to face rear surfaces of the first and second non-display areas 120 and 220.

The first and second flexible printed circuit boards 140 and 240 are arranged to be rolled toward rear surfaces of the first and second display areas 110 and 210. The first and second flexible films 321 and 322 are attached to the rear surfaces of the first and second non-display areas 120 and 220. On a front surface, the first and second flexible films 321 and 322 are visible only in a space by a spaced distance W between the first and second non-display areas 120 and 220. The first read out IC 311 packaged on the first flexible film 321 and the second read out IC 312 packaged on the second flexible film 322 are arranged toward the front surfaces of the first and second display areas 110 and 210. Therefore, the first and second read out ICs 311 and 312 are arranged on an inner curved surface if the first and second flexible films 321 and 322 are arranged to be rolled.

Figure 6:
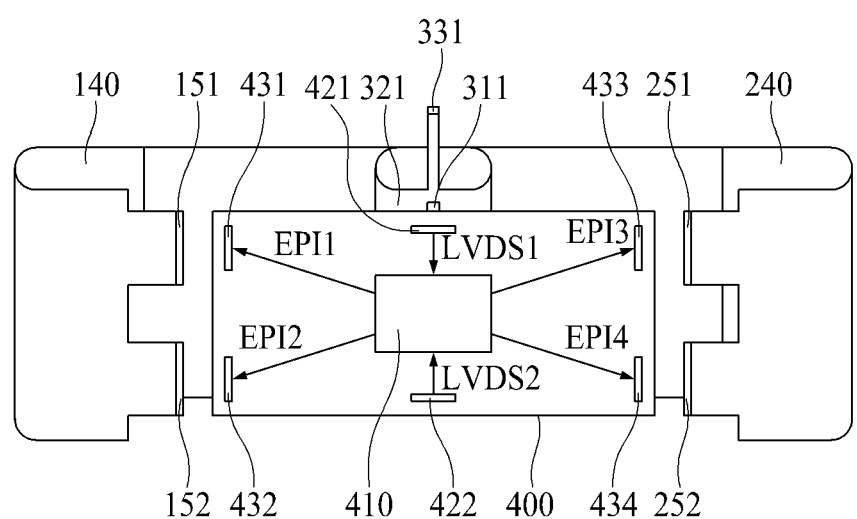
FIG. 6 is a rear view illustrating an assembly state of a two-panel display device according to one aspect of the present disclosure.

FIG. 6 is a rear view illustrating an assembly state of a two-panel display device according to one aspect of the present disclosure.

The two-panel display device according to one aspect further includes a timing controller circuit board 400. The timing controller circuit board 400 packages the timing controller 410 thereon. The timing controller 410 controls option timing of the first and second source driver ICs 131, 132, 231 and 232.

The timing controller 410 generates timing signals for controlling the operation timing of the first and second source driver ICs 131, 132, 231 and 232. The timing signals include a vertical synchronization signal, a horizontal synchronization signal, a data enable signal, and a dot clock. The timing controller 410 includes the timing signals in first to fourth EPI signals EPI1 to EPI4 of an embedded point-to-point interface type and then supplies the signals to the first and second source driver ICs 131, 132, 231 and 232.

The timing controller 410 is supplied with the left and right sensing data LSEN_DATA and RSEN_DATA generated using the left sensing voltage and the right sensing voltage LSEN and RSEN from the first and second read out ICs 311 and 312. The first and second read out ICs 311 and 312 add the left and right sensing data LSEN_DATA and RSEN_DATA to first and second LVDS signals LVDS1 and LVDS2 of a low voltage differential signal type and supply the signals to the timing controller 410.

The timing controller 410 corrects the digital video data DATA by reflecting the left and right sensing data LSEN_DATA and RSEN_DATA. The timing controller 410 includes the corrected digital video data in the first to fourth EPI signals EPI1 to EPI4 and then supplies the data to the first and second source driver ICs 131, 132, 231 and 232.

The timing controller circuit board 400 according to one aspect further includes first data output terminals 431 and 432, second data output terminals 433 and 434, a first sensing input terminal 421, and a second sensing input terminal 422.

The first data output terminals 431 and 432 are arranged to adjoin a corner portion of a short side of one side of the timing controller circuit board 400. The first data output terminals 431 and 432 are connected with the first data input terminals 151 and 152 provided at one side of the first flexible printed circuit board 140 for packaging the first source driver ICs 131 and 132. At least one or more first data output terminals 431 and 432 may be connected with at least one or more first data input terminals 151 and 152. The first data output terminals 431 and 432 are supplied with the first and second EPI signals EPI1 and EPI2 from the timing controller 410. The first data output terminals 431 and 432 supply the first and second EPI signals EPI1 and EPI2 to the first data input terminals 151 and 152.

The second data output terminals 433 and 434 are arranged to adjoin a corner portion of a short side of the other side of the timing controller circuit board 400. The second data output terminals 433 and 434 are connected with the second data input terminals 251 and 252 provided at one side of the second flexible printed circuit board 240 for packaging the second source driver ICs 231 and 232. At least one or more second data output terminals 433 and 434 may be connected with at least one or more second data input terminals 153 and 154. The second data output terminals 433 and 434 are supplied with the third and fourth EPI signals EPI3 and EPI4 from the timing controller 410. The second data output terminals 433 and 434 supply the third and fourth EPI signals EPI3 and EPI4 to the second data input terminals 153 and 154.

The first sensing input terminal 421 is arranged to adjoin a long side of one side of the timing controller circuit board 400. The first sensing input terminal 421 is connected with the first sensing output terminal 331 provided at one side of the first flexible film 321 for packaging the first read out IC 311. The first read out IC 311 generates a first LVDS signal LVDS1. The first sensing output terminal 331 supplies the first LVDS signal LVDS1 to the first sensing input terminal 421. The first sensing input terminal 421 supplies the first LVDS signal LVDS1 to the timing controller 410.

The second sensing input terminal 422 is arranged to adjoin a long side of the other side of the timing controller circuit board 400. The second sensing input terminal 422 is connected with the second sensing output terminal 332 provided at one side of the second flexible film 322 for packaging the second read out IC 312. The second read out IC 312 generates a second LVDS signal LVDS2. The second sensing output terminal 332 supplies the second LVDS signal LVDS2 to the second sensing input terminal 422. The second sensing input terminal 422 supplies the second LVDS signal LVDS2 to the timing controller 410.

FIGS. 7 to 11 are plane views illustrating a two-panel display device according to other aspects of the present disclosure.

Figure 7:
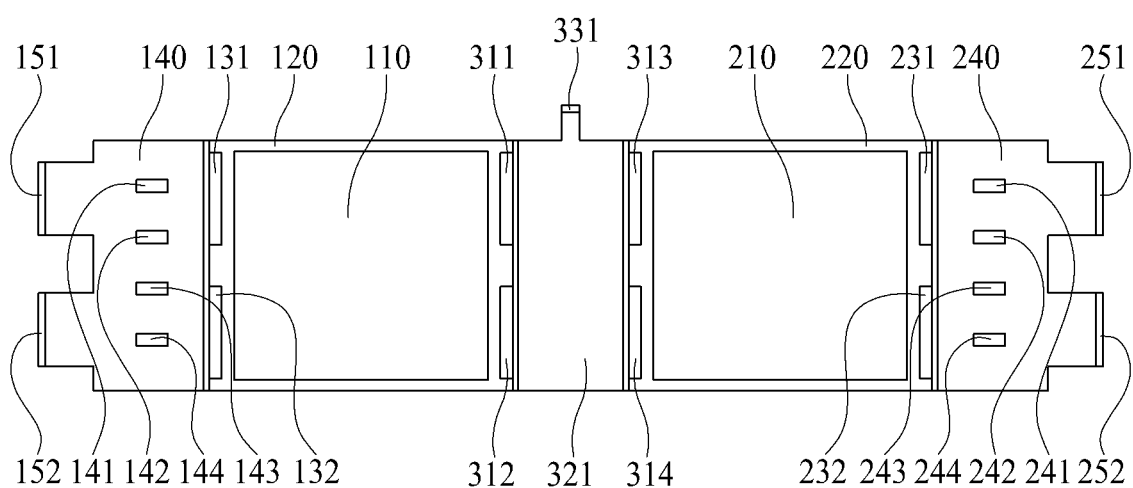
FIGS. 7 to 11 are plane views illustrating a two-panel display device according to other aspects of the present disclosure.

FIG. 7 discloses a structure that the first to fourth read out ICs 311 to 314 are arranged on the first and second non-display areas 120 and 220 and thus provided in a chip on glass (COG) type. FIG. 7 illustrates that four read out ICs 311 to 314 are arranged on the first and second non-display areas 120 and 220 in pairs. However, without limitation to this example, at least one or more read out ICs 311 to 314 may be arranged on the first non-display area 120 and at the same time at least one or more read out ICs 311 to 314 may be arranged on the second non-display area 220. Also, the number of the read out ICs 311 to 314 arranged on the first non-display area 120 may be different from the number of the read out ICs 311 to 314 arranged on the second non-display area 220.

The first and second read out ICs 311 and 312 sense threshold voltages of the pixels provided in the first display area 110. The first and second read out ICs 311 and 312 generate first sensing data by using a sensing voltage sensed in the first display area 110. The first and second read out ICs 311 and 312 output the first sensing data through the first flexible film 321. The first flexible film 321 connects the first and second non-display areas 120 and 220. The first flexible film 321 outputs the first sensing data through the first sensing output terminal 331.

The third and fourth read out ICs 313 and 314 sense threshold voltages of the pixels provided in the second display area 210. The third and fourth read out ICs 313 and 314 generate second sensing data by using a sensing voltage sensed in the second display area 210. The third and fourth read out ICs 313 and 314 output the second sensing data through the first flexible film 321. The first flexible film 321 outputs the second sensing data through the first sensing output terminal 331.

Figure 8:
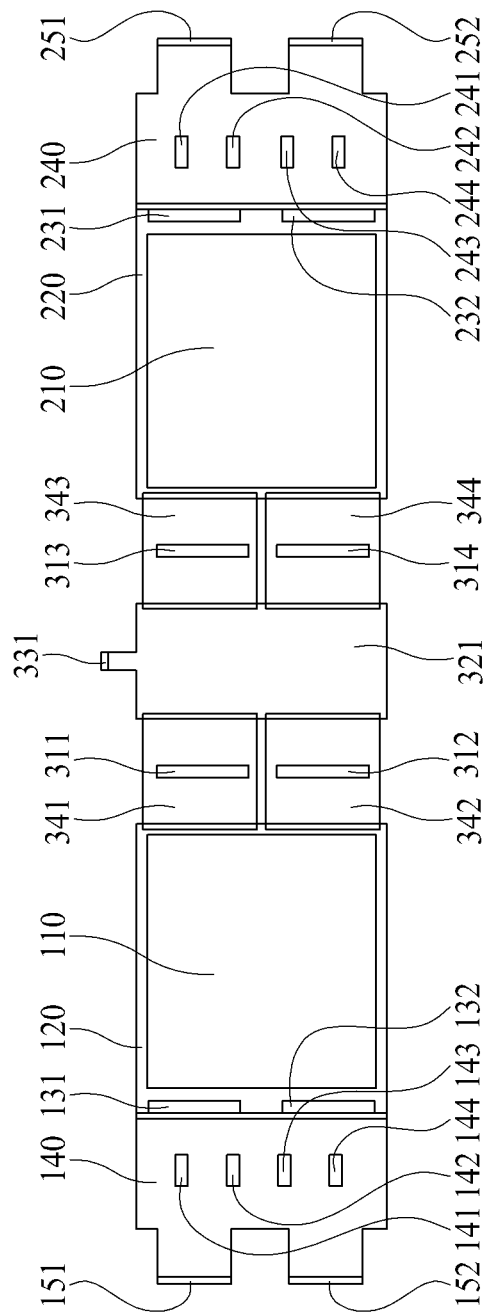

FIG. 8 discloses a structure that the first to fourth read out ICs 311 to 314 are arranged on first and second chip on films 341 to 344 and thus provided in a chip on film (COF) type. FIG. 8 illustrates that four read out ICs 311 to 314 are connected with the first and second non-display areas 120 and 220 in pairs. However, without limitation to this example, at least one or more read out ICs 311 to 314 may be connected with the first non-display area 120 and at the same time at least one or more read out ICs 311 to 314 may be connected with the second non-display area 220. Also, the number of the read out ICs 311 to 314 connected with the first non-display area 120 may be different from the number of the read out ICs 311 to 314 connected with the second non-display area 220.

The first and second read out ICs 311 and 312 are arranged on the first chip on films 341 and 342 connected with the first non-display area 120 surrounding the first display area 110. The first chip on film 341 for packaging the first read out IC 311 and the first chip on film 342 for packaging the second read out IC 312 may be provided to be spaced apart from each other. The first chip on films 341 and 342 connect the first non-display area 120 with the first flexible film 321. The first and second read out ICs 311 and 312 sense threshold voltages of the pixels provided in the first display area 110. The first and second read out ICs 311 and 312 generate first sensing data by using a sensing voltage sensed in the first display area 110. The first and second read out ICs 311 and 312 output the first sensing data to the outside through the first chip on films 341 and 342 and the first flexible film 321.

The third and fourth read out ICs 313 and 314 are arranged on the second chip on films 343 and 344 connected with the second non-display area 220 surrounding the second display area 210. The second chip on film 343 for packaging the third read out IC 313 and the second chip on film 344 for packaging the fourth read out IC 314 may be provided to be spaced apart from each other. The second chip on films 343 and 344 connect the second non-display area 220 with the first flexible film 321. The third and fourth read out ICs 313 and 314 sense threshold voltages of the pixels provided in the second display area 210. The third and fourth read out ICs 313 and 314 generate second sensing data by using a sensing voltage sensed in the second display area 210. The third and fourth read out ICs 313 and 314 output the second sensing data to the outside through the second chip on films 343 and 344 and the first flexible film 321.

Figure 9:
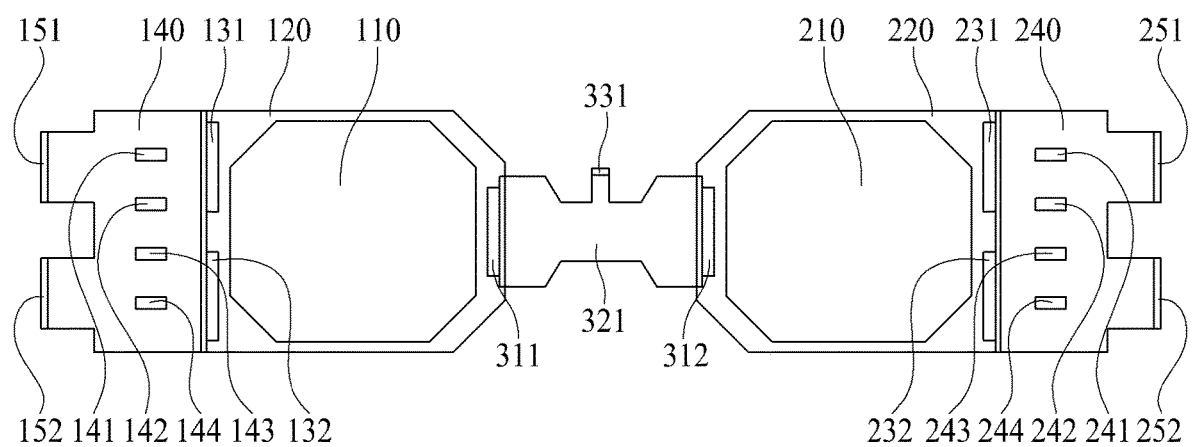
Figure 10:
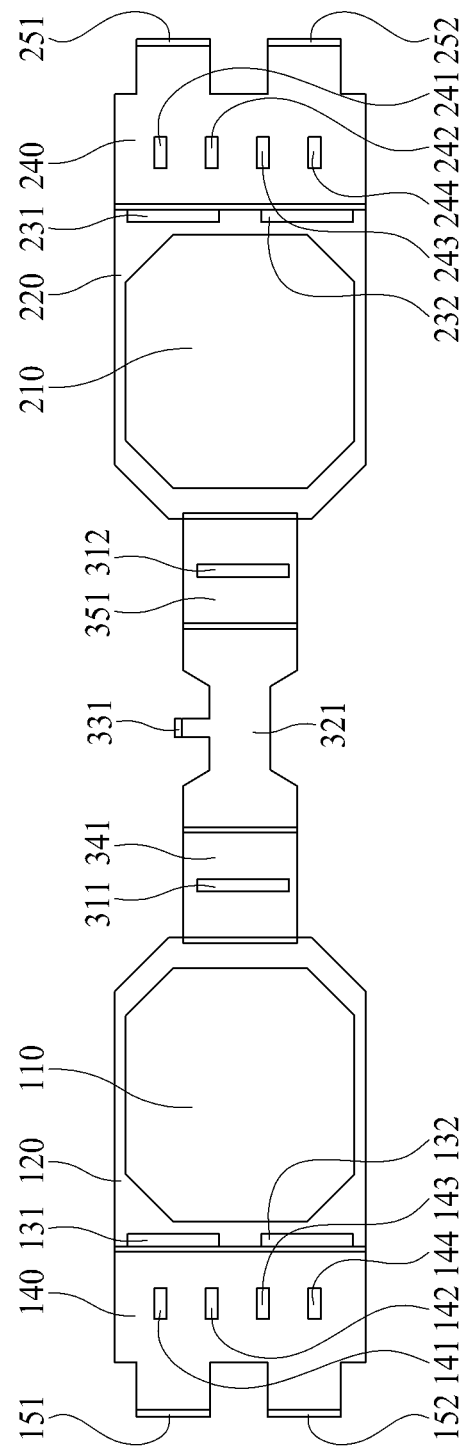

Although an arrangement structure of the first and second read out ICs 311 and 312 in FIG. 9 is the same as that of the first and second read out ICs 311 and 312 in FIG. 7, FIG. 9 illustrates that the first and second display areas 110 and 210 are hetero-displays having a fillet corner portion. Although an arrangement structure of the first and second read out ICs 311 and 312 in FIG. 10 is the same as that of the first and second read out ICs 311 and 312 in FIG. 8, FIG. 10 illustrates that the first and second display areas 110 and 210 are hetero-displays having a fillet corner portion.

The hetero-displays are terms that refer to display devices each of which includes a display panel having an atypical shape or a display panel having a curved corner shape. In addition to a rectangular display panel having a long side and a short side, various types of display panels are manufactured in accordance with requests of consumers. Even in case of the hetero-display, the first and second read out ICs 311 and 312 may be arranged between the two display areas 110 and 210 to enable voltage sensing for performing external compensation.

Figure 11:
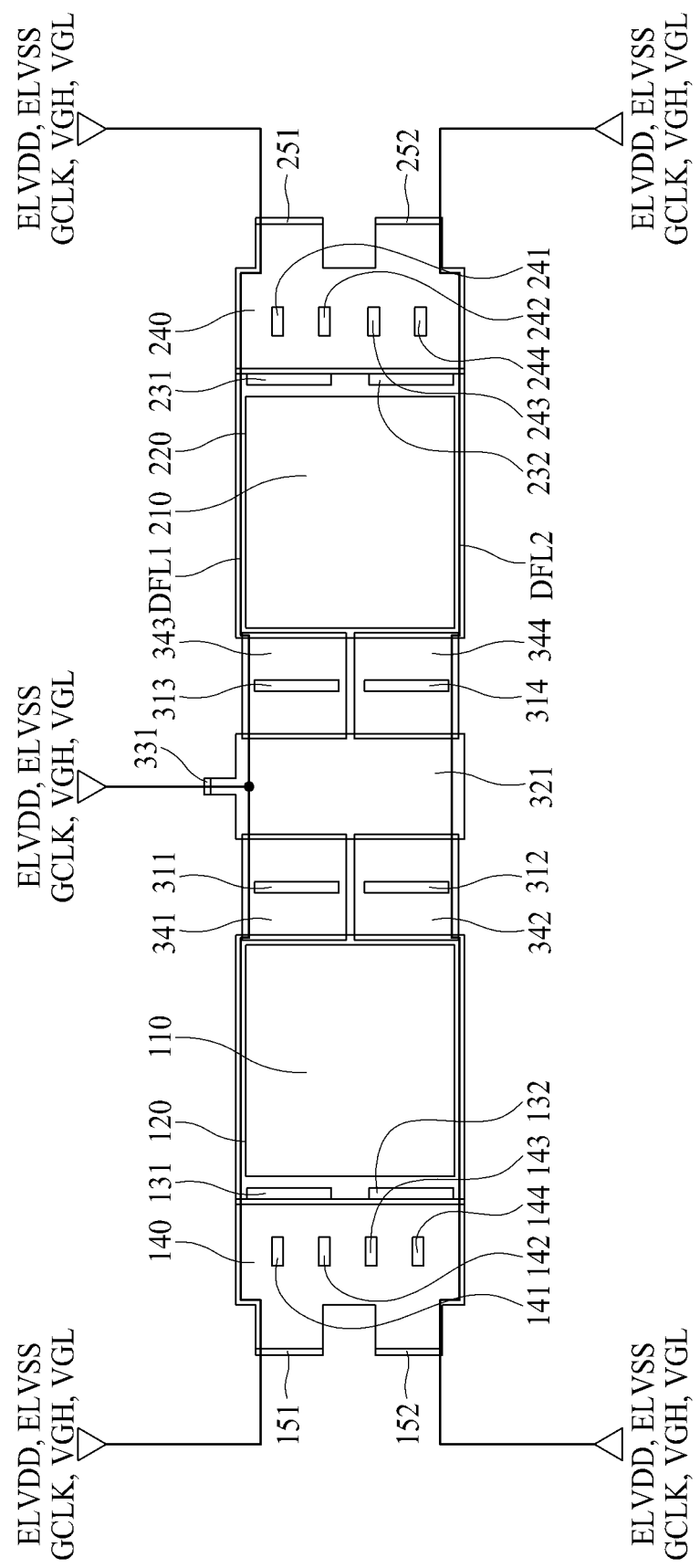

A double-feeding structure of diving voltages ELVDD, ELVSS, VGH and VGL and a gate clock GCLK is disclosed in FIG. 11 in a structure having a first flexible printed circuit board 140 arranged at one side of the first non-display area 120, a second flexible printed circuit board 240 arranged at one side of the second non-display area 220, and a first flexible film 321 arranged between the first display area 110 and the second display area 210.

The driving voltages ELVDD, ELVSS, VGH and VGL are voltages for driving a driving transistor and switching transistors of pixels provided in the first and second display areas 110 and 210. The gate clock GCLK is a clock required to supply a gate signal from a gate driver if the gate driver is realized in a gate in panel type. The driving voltages ELVDD, ELVSS, VGH and VGL and the gate clock GCLK should uniformly be supplied to the first and second display areas 110 and 210 so as not to generate driving deviation of pixels per area.

The first flexible printed circuit board 140 and the first flexible film 321 according to one aspect simultaneously supply the driving voltages ELVDD, ELVSS, VGH and VGL and the gate clock GCLK to the first display area 110. The second flexible printed circuit board 240 and the first flexible film 321 according to one aspect simultaneously supply the driving voltages ELVDD, ELVSS, VGH and VGL and the gate clock GCLK to the second display area 210.

The driving voltages ELVDD, ELVSS, VGH and VGL and the gate clock GCLK are simultaneously supplied to the first display area 110 through the first data input terminals 151 and 152 of the first flexible printed circuit board 140 and the first sensing output terminal 331 of the first flexible film 321. Also, the driving voltages ELVDD, ELVSS, VGH and VGL and the gate clock GCLK are simultaneously supplied to the second display area 210 through the second data input terminals 251 and 252 of the second flexible printed circuit board 240 and the first sensing output terminal 331 of the first flexible film 321.

The first data input terminal 151 provided at the upper portion of the first flexible printed circuit board 140, the first sensing output terminal 331 of the first flexible film 321 and the second data input terminal 251 provided at the upper portion of the second flexible printed circuit board 240 are connected with one another by a first double feeding line DFL1. The first double feeding line DFL1 supplies the driving voltages ELVDD, ELVSS, VGH and VGL and the gate clock GCLK to the upper portions of the first and second display areas 110 and 210.

The first data input terminal 152 provided at the lower portion of the second flexible printed circuit board 240 and the second data input terminal 252 provided at the lower portion of the second flexible printed circuit board 240 are connected with each other by a second double feeding line DFL2. The second double feeding line DFL2 supplies the driving voltages ELVDD, ELVSS, VGH and VGL and the gate clock GCLK to the lower portions of the first and second display areas 110 and 210.

The first and second double feeding lines DFL1 and DFL2 may supply the driving voltages ELVDD, ELVSS, VGH and VGL and the gate clock GCLK to the first and second display areas 110 and 210 while minimizing deviation of the driving voltages ELVDD, ELVSS, VGH and VGL and the gate clock GCLK. Therefore, the driving voltages ELVDD, ELVSS, VGH and VGL and the gate clock GCLK may uniformly be supplied, whereby picture quality of the first and second display areas 110 and 210 may be improved.

As described above, according to the present disclosure, the following advantageous effects may be obtained.

The two-panel display device according to one aspect of the present disclosure may perform external compensation even without adding separate elements to source driver ICs by separately arranging read out ICs, which can perform external compensation. Particularly, the read out ICs may be arranged between the first and second display areas opposite to the first and second source driver ICs, whereby the read out ICs may be supplied with all of the sensing voltages of the panel arranged at both sides, and may generate all of the sensing data for compensating for the panel arranged at both sides. Therefore, the two-panel display device according to the present disclosure may compensate for the threshold voltage of the driving transistor and degradation of the light emitting diode even after launching by realizing the structure for performing external compensation even in case of high resolution.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various aspects described above can be combined to provide further aspects. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the aspects can be modified, if necessary to employ concepts of the various patents, applications and publications to provide yet further aspects.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. A two-panel display device comprising:
   first source driver ICs arranged on a first non-display area surrounding a side of a first display area and supplying a first data voltage;
   second source driver ICs arranged on a second non-display area surrounding a side of a second display area spaced apart from the first display area and supplying a second data voltage; and
   one or more read out ICs arranged between the first and second display areas and receiving sensing voltages sensed in the first and second display areas,
   wherein the first source driver ICs are arranged at an opposite side to the read out ICs with respect to the first display area, and the second source driver ICs are arranged at an opposite side to the read out ICs with respect to the second display area.

2. The two-panel display device according to claim 1, wherein the read out ICs supply a reference voltage to the first and second display areas.

3. The two-panel display device according to claim 1, further comprising a first flexible printed circuit board attached to one side of the first non-display area adjacent to the first source driver ICs and a second flexible printed circuit board attached to one side of the second non-display area adjacent to the second source driver ICs.

4. The two-panel display device according to claim 3, further comprising a first data input terminal disposed at one side of the first flexible printed circuit board and a second data input terminal disposed at one side of the second flexible printed circuit board.

5. The two-panel display device according to claim 1, wherein the one or more read out ICs includes first and second read out ICs, wherein the first read out IC is packaged on a first flexible film arranged between the first display area and the second display area, and the second read out IC is packaged on a second flexible film arranged between the first display area and the second display area.

6. The two-panel display device according to claim 5, further comprising a first sensing output terminal disposed at one side of the first flexible film and a second sensing output terminal disposed at one side of the second flexible film.

7. The two-panel display device according to claim 5, wherein the first and second flexible films are arranged to be rolled toward rear surfaces of the first and second display areas.

8. The two-panel display device according to claim 1, wherein the first and second display areas include a plurality of pixels for display an image and a plurality of data lines for supplying a data voltage to the plurality of pixels and a plurality of sensing lines for sensing threshold voltages of the plurality of pixels, wherein a supply direction of the data voltage is the same as a sensing direction of the threshold voltages.

9. The two-panel display device according to claim 8, wherein the plurality of sensing lines supplies a reference voltage to the plurality of pixels, and the supply direction of the data voltage is opposite to a supply direction of the reference voltage.

10. The two-panel display device according to claim 1, wherein each of the one or more read out ICs includes:
    a sampling circuit sampling the sensing voltage;
    an analog-digital converter converting the sampled sensing voltage to sensing data; and
    an integrated portion aligning the converted sensing data.

11. The two-panel display device according to claim 1, further comprising a timing controller circuit board for packaging a timing controller controlling operation timings of the first and second source driver ICs, wherein the timing controller is supplied with sensing data generated by using the sensing voltage from the one or more read out ICs.

12. The two-panel display device according to claim 11, wherein the timing controller circuit board includes:
    a first data output terminal connected with a first data input terminal provided at one side of the first flexible printed circuit board attached to one side of the first non-display area;
    a second data output terminal connected with a second data input terminal provided at one side of the second flexible printed circuit board attached to one side of the second non-display area;
    a first sensing input terminal connected with a first sensing output terminal provided at one side of the first flexible film for packaging one of the one or more read out ICs; and
    a second sensing input terminal connected with a second sensing output terminal provided at one side of the second flexible film for packaging the other of the one or more read out ICs.

13. The two-panel display device according to claim 1, wherein the one or more read out ICs are arranged on the first non-display area surrounding the first display area and the second non-display area surrounding the second display area and outputting the sensing data through a first flexible film for connecting the first and second non-display areas with each other.

14. The two-panel display device according to claim 1, wherein the one or more read out ICs are arranged on a first chip on film connected with the first non-display area surrounding the first display area and the one or more read out ICs are arranged on a second chip on film connected with the second non-display area surrounding the second display area, and the first and second chip on films connect the first and second non-display areas with a first flexible film.

15. The two-panel display device according to claim 1, wherein the first and second display areas have fillet corner portions, and the one or more read out ICs are arranged on the first non-display area surrounding the first display area and the second non-display area surrounding the second display area and outputting the sensing data through a first flexible film for connecting the first and second non-display areas with each other.

16. The two-panel display device according to claim 1, wherein the first and second display areas have fillet corner portions, and the one or more read out ICs are arranged on a first chip on film connected with the first non-display area surrounding the first display area and the one or more read out ICs are arranged on a second chip on film connected with the second non-display area surrounding the second display area, and the first and second chip on films connect the first and second non-display areas with a first flexible film.

17. The two-panel display device according to claim 1, further comprising:
a first flexible printed circuit board arranged at one side of the first non-display area;
a second flexible printed circuit board arranged at one side of the second non-display area; and
a first flexible film arranged between the first display area and the second display area,
wherein the first flexible printed circuit board and the first flexible film simultaneously supply driving voltages and a gate clock to the first display area, and the second flexible printed circuit board and the first flexible film simultaneously supply the driving voltages and the gate clock to the second display area.

18. A two-panel display device comprising:
a plurality of first source driver ICs disposed at a first non-display area adjacent to a side of a first display area and supplying a first data voltage;
a plurality of second source driver ICs disposed at a second non-display area adjacent to a side of a second display area and supplying a second data voltage;
first and second read out ICs disposed between the first and second display areas and receiving sensing voltages sensed at the first and second display areas;
a first flexible printed circuit board disposed at one side of the first non-display area;
a second flexible printed circuit board disposed at one side of the second non-display area; and
a first flexible film disposed between the first display area and the second display area,
wherein the first flexible printed circuit board and the first flexible film simultaneously supply driving voltages and a gate clock to the first display area, and the second flexible printed circuit board and the first flexible film simultaneously supply the driving voltages and the gate clock to the second display area.

19. The two-panel display device according to claim 18, wherein the plurality of first source driver ICs is disposed at an opposite side to one of the first and second read out ICs with respect to the first display area, and the plurality of second source driver ICs is disposed at an opposite side to another of the first and second read out ICs with respect to the second display area.

20. The two-panel display device according to claim 18, further comprising a timing controller circuit board for packaging a timing controller controlling operation timings of the pluralities of first and second source driver ICs, wherein the timing controller is supplied with sensing data generated by using the sensing voltage from the first and second read out ICs.

\* \* \* \* \*